(12) United States Patent
Xiao et al.

(10) Patent No.: US 11,106,070 B2
(45) Date of Patent: Aug. 31, 2021

(54) ARRAY SUBSTRATE AND MANUFACTURING METHOD OF THE SAME AND DISPLAY PANEL

(71) Applicant: WUHAN CHINA STAR OPTOELECTRONICS TECHNOLOGY CO., LTD, Wuhan (CN)

(72) Inventors: Juncheng Xiao, Wuhan (CN); Chao Tian, Wuhan (CN)

( * ) Notice: Subject to any disclaimer, the term of this patent is extended or adjusted under 35 U.S.C. 154(b) by 445 days.

(21) Appl. No.: 16/306,587

(22) PCT Filed: Aug. 10, 2018

(86) PCT No.: PCT/CN2018/099799
§ 371 (c)(1),
(2) Date: Dec. 3, 2018

(87) PCT Pub. No.: WO2019/210602
PCT Pub. Date: Nov. 7, 2019

(65) Prior Publication Data
US 2021/0181556 A1    Jun. 17, 2021

(30) Foreign Application Priority Data
May 4, 2018   (CN) .......................... 201810420697.6

(51) Int. Cl.
*G02F 1/1333*      (2006.01)
*G02F 1/1368*      (2006.01)
(Continued)

(52) U.S. Cl.
CPC ...... *G02F 1/13338* (2013.01); *G02F 1/13685* (2021.01); *G02F 1/134363* (2013.01);
(Continued)

(58) Field of Classification Search
CPC ............. G02F 1/13338; G02F 1/13685; G02F 1/136231; G02F 2202/104;
(Continued)

(56) References Cited

U.S. PATENT DOCUMENTS

2006/0030089 A1    2/2006 Chung
2016/0291750 A1    10/2016 Chai et al.
(Continued)

FOREIGN PATENT DOCUMENTS

CN         1452250 A      10/2003
CN       104637955 A       5/2015
(Continued)

*Primary Examiner* — Charles S Chang (57) ABSTRACT

The invention provides an array substrate, a manufacturing method thereof and a display panel. The array substrate includes a substrate, a buffer layer, an active layer, a first insulating layer, a gate electrode, a second insulating layer, a touch signal line, a source and drain electrode, a touch signal line, a source and drain electrode, a first electrode, a planarization layer, and a second electrode. The first electrode and the second electrode are respectively connected to one of the drain electrode and the touch signal line. Thus, photomask processes can be reduced, and production cycle can be shortened.

17 Claims, 8 Drawing Sheets

(51) Int. Cl.
*G02F 1/1362* (2006.01)
*G02F 1/1343* (2006.01)
*G06F 3/041* (2006.01)
*H01L 27/12* (2006.01)

(52) U.S. Cl.
CPC ...... *G02F 1/136231* (2021.01); *G06F 3/0412* (2013.01); *H01L 27/124* (2013.01); *H01L 27/1288* (2013.01); *G02F 2202/104* (2013.01); *G06F 2203/04103* (2013.01)

(58) Field of Classification Search
CPC ............ G02F 1/134363; G06F 3/0412; G06F 2203/04103; H01L 27/124; H01L 27/1288
USPC ...................................... 349/42–43
See application file for complete search history.

(56) References Cited

U.S. PATENT DOCUMENTS

| | | | |
|---|---|---|---|
| 2016/0328058 | A1 | 11/2016 | Peng |
| 2017/0147121 | A1* | 5/2017 | Yang .................. H01L 27/3246 |
| 2017/0212397 | A1 | 7/2017 | Cao |
| 2018/0292693 | A1 | 10/2018 | Tsai et al. |
| 2019/0004660 | A1* | 1/2019 | Guo .................. H01L 23/5329 |
| 2019/0064568 | A1 | 2/2019 | Zheng et al. |

FOREIGN PATENT DOCUMENTS

| | | |
|---|---|---|
| CN | 104777692 A | 7/2015 |
| CN | 105514119 A | 4/2016 |
| CN | 105527767 A | 4/2016 |
| CN | 106653770 A | 5/2017 |
| CN | 106910750 A | 6/2017 |
| CN | 107479284 A | 12/2017 |

\* cited by examiner

ARRAY SUBSTRATE AND MANUFACTURING METHOD OF THE SAME AND DISPLAY PANEL

FIELD OF INVENTION

The present invention relates to the field of display technologies, and in particular to an array substrate, a manufacturing method of the same, and a display panel.

BACKGROUND OF INVENTION

Low temperature poly-silicon (LTPS) has a high electron mobility, which is advantageous to reduce the area of thin film transistor (TFT) devices, so that aperture ratio of the pixels increases, brightness of display panel increases, and reduces total power consumption of the display panel.

However, manufacturing process of a display panel based on LTPS technology is more complicated, which means:

a thin film transistor array substrate, which is manufactured based on the LTPS technology needs more film layers (generally requires 10 layers or more layers), which requires use of a larger number of photomasks.

Therefore, traditional manufacturing methods of the thin film transistor array substrate based on the LTPS technology go against shortening of production cycle.

Hence, it is necessary to propose a new technical solution to solve the above technical problems.

SUMMARY OF INVENTION

An object of the present invention is to provide an array substrate, a manufacturing method the same, and a display panel, which can reduce the number of photomask processes required during the manufacturing of the array substrate based on the LTPS technology, and shorten the production cycle of the array substrate.

To solve the above problems, the technical solution of the present invention is as follows:

An array substrate, comprising: a substrate; a buffer layer disposed on the substrate; an active layer disposed on the buffer layer; a first insulating layer; a gate electrode disposed on the first insulating layer; a second insulating layer; a touch signal line, a source electrode, and a drain electrode all provided in the same layer and disposed on the second insulating layer, wherein the source electrode is connected to the active layer and the drain electrode is connected to the active layer; a first electrode disposed on the second insulating layer; a planarization layer disposed on the first electrode; a second electrode disposed on the planarization layer; wherein one of the first electrode and the second electrode is connected to the drain electrode, and the other of the first electrode and the second electrode is connected to the touch signal line; wherein the array substrate further comprises: a connecting electrode and a third insulating layer provided between the second insulating layer and the planarization layer, wherein the second electrode is connected to the drain electrode through a fifth via provided in the planarization layer and the third insulating layer; wherein the first electrode is disposed on the third insulating layer, the connecting electrode is connected to the touch signal line and the first electrode through a third via provided in the planarization layer and the third insulating layer and the connecting electrode is connected to the touch signal line and the first electrode through a fourth via provided in the planarization layer; wherein the active layer is provided with two lightly doped regions and two heavily doped regions, the two heavily doped regions are respectively provided at two respective side ends of the active layer, and the two lightly doped regions are respectively adjacent to the two respective heavily doped regions; and wherein the source electrode and the drain electrode are respectively connected to the two respective heavily doped regions of the active layer through a first via and a second via both penetrating the second insulating layer.

An array substrate, comprising: a substrate; a buffer layer disposed on the substrate; an active layer disposed on the buffer layer; a first insulating layer; a gate electrode disposed on the first insulating layer; a second insulating layer; a touch signal line, a source electrode, and a drain electrode all provided in the same layer and disposed on the second insulating layer, wherein the source electrode is connected to the active layer and the drain electrode is connected to the active layer; a first electrode disposed on the second insulating layer; a planarization layer disposed on the first electrode; and a second electrode disposed on the planarization layer; wherein one of the first electrode and the second electrode is connected to the drain electrode, and the other of the first electrode and the second electrode is connected to the touch signal line.

In the above mentioned array substrate, the first electrode is connected to the drain electrode, at least a portion of the first electrode is disposed on the drain electrode; and the touch signal line is connected to the second electrode through a third via provided in the planarization layer.

In the above mentioned array substrate, the first electrode is connected to the drain electrode, at least a portion of the drain electrode is disposed on the first electrode; and the touch signal line is connected to the second electrode through a third via provided in the planarization layer.

In the above mentioned array substrate, the array substrate further comprises: a third insulating layer provided between the second insulating layer and the planarization layer; and a connecting electrode, wherein the second electrode is connected to the drain electrode through a fifth via provided in the planarization layer and the third insulating layer; and the first electrode is disposed on the third insulating layer, the connecting electrode is connected to the touch signal line and the first electrode through a third via provided in the planarization layer and the third insulating layer and the connecting electrode is connected to the touch signal line and the first electrode through a fourth via provided in the planarization layer.

In the above mentioned array substrate, the active layer is provided with two lightly doped regions and two heavily doped regions, the two heavily doped regions are respectively provided at two respective side ends of the active layer, and the two lightly doped regions are respectively adjacent to the two respective heavily doped regions; and the source electrode and the drain electrode are respectively connected to the two respective heavily doped regions of the active layer through a first via and a second via both penetrating the second insulating layer.

A manufacturing method of an array substrate, comprising: a step A of disposing a buffer layer on a substrate; a step B of disposing a semiconductor material layer on the buffer layer, and providing a first photomask process to the semiconductor material layer to form an active layer; a step C of disposing a first insulating layer on the active layer and the buffer layer; a step D of disposing a first metal layer on the first insulating layer, and providing a second photomask process to the first metal layer to form a gate electrode; a step E of disposing a second insulating layer on the gate electrode and the first insulating layer; a step F of disposing a second metal layer on the second insulating layer, and providing a fourth photomask process to the second metal layer to form a touch signal line on the second insulating layer, and to form a source electrode and a drain electrode on the second insulating layer, wherein the source electrode and the drain electrode are connected to the active layer; a step G of disposing a first electrode layer on the second insulating layer, and providing a fifth photomask process to the first electrode layer to form a first electrode; a step H of disposing a planarization layer on the first electrode and the second insulating layer; and a step I of disposing a second electrode layer on the planarization layer, and providing a seventh photomask process to the second electrode layer to form a second electrode; wherein one of the first electrode and the second electrode is connected to the drain electrode, and the other of the first electrode and the second electrode is connected to the touch signal line.

In the above mentioned manufacturing method of the array substrate, in a case that the first electrode is connected to the drain electrode, at least a portion of the first electrode is disposed on the drain electrode, the step G is provided after the step F, and the step G further comprises: disposing the first electrode layer on the second insulating layer and the drain electrode, and providing a fifth photomask process to the first electrode layer to form the first electrode.

In the above mentioned manufacturing method of the array substrate, in a case that the first electrode is connected to the drain electrode, at least a portion of the drain electrode is disposed on the first electrode, the step F is provided after the step G, and the step F further comprises: disposing the second metal layer on the second insulating layer and the first electrode, and providing the fourth photomask process to the second metal layer to form the touch signal line on the second insulating layer, and to form the source electrode and the drain electrode on the second insulating layer.

In the above mentioned manufacturing method of the array substrate, after the step H and before the step I, the method further comprises: a step J of providing a sixth photomask process to the planarization layer to form a third via in a portion of the planarization layer which is corresponding to the touch signal line.

In the above mentioned manufacturing method of the array substrate, in a case that the second electrode is connected to the drain electrode, the array substrate further comprises a third insulating layer; and after the step F and before the step G, the method further comprises: a step K of disposing the third insulating layer on the second insulating layer, the touch signal line, the source electrode, and the drain electrode.

In the above mentioned manufacturing method of the array substrate, the first electrode is disposed on the third insulating layer; and the step G further comprises: disposing the first electrode layer on the third insulating layer stacked on the second insulating layer, and providing the fifth photomask process to the first electrode layer to form the first electrode.

In the above mentioned manufacturing method of the array substrate, the step H further comprises: disposing the planarization layer on the first electrode and on the third insulating layer.

In the above mentioned manufacturing method of the array substrate, after the step H and before the step I, the method further comprises: a step L of providing the sixth photomask process to the planarization layer and the third insulating layer to respectively form a third via, a fourth via, and a fifth via in a portion of the planarization layer and the third insulating layer respectively corresponding to the touch signal line, the first electrode and the drain electrode.

In the above mentioned manufacturing method of the array substrate, the array substrate further comprises a connecting electrode; and the step I further comprises: disposing the second electrode layer on the planarization layer, and providing the seventh photomask process to the second electrode layer to form the second electrode and the connecting electrode, wherein the connecting electrode is connected to the touch signal line and the first electrode.

A display panel, including a color filter substrate, a liquid crystal layer, and an array substrate, wherein the color filter substrate and the array substrate are stacked and integrated as a whole, and the liquid crystal layer is disposed between the color filter substrate and the array substrate; the array substrate comprising: a substrate; a buffer layer disposed on the substrate; an active layer disposed on the buffer layer; a first insulating layer; a gate electrode disposed on the first insulating layer; a second insulating layer; a touch signal line, a source electrode, and a drain electrode all provided in the same layer and disposed on the second insulating layer, wherein the source electrode is connected to the active layer and the drain electrode is connected to the active layer; a first electrode disposed on the second insulating layer; a planarization layer disposed on the first electrode; and a second electrode disposed on the planarization layer; wherein one of the first electrode and the second electrode is connected to the drain electrode, and the other of the first electrode and the second electrode is connected to the touch signal line.

In the above mentioned display panel, the first electrode is connected to the drain electrode, at least a portion of the first electrode is disposed on the drain electrode; and the touch signal line is connected to the second electrode through a third via provided in the planarization layer.

In the above mentioned display panel, the first electrode is connected to the drain electrode, at least a portion of the drain electrode is disposed on the first electrode; and the touch signal line is connected to the second electrode through a third via provided in the planarization layer.

In the above mentioned display panel, the array substrate further comprises: a third insulating layer provided between the second insulating layer and the planarization layer; and a connecting electrode, wherein the second electrode is connected to the drain electrode through a fifth via provided in the planarization layer and the third insulating layer; and the first electrode is disposed on the third insulating layer, the connecting electrode is connected to the touch signal line and the first electrode through a third via provided in the planarization layer and the third insulating layer and the connecting electrode is connected to the touch signal line and the first electrode through a fourth via provided in the planarization layer.

In the above mentioned display panel, the active layer is provided with two lightly doped regions and two heavily doped regions, the two heavily doped regions are respectively provided at two respective side ends of the active layer, the two lightly doped regions are respectively adjacent to the two respective heavily doped regions; and the source electrode and the drain electrode are respectively connected to the respective two heavily doped regions of the active layer through a first via and a second via both penetrating the second insulating layer.

To make the above content of the present invention clearer and easier to understand, it is described in detail below in examples of preferred embodiments with the accompanying drawings.

DETAILED DESCRIPTION OF PREFERRED EMBODIMENTS

The term "embodiment" used herein refers to an example, implement, or illustration. In addition, articles "a" and "an" used in this application and the appended claims should generally be construed to mean "one or more than one", unless specific defined or clear from the context to be directed to a singular form.

The display panel according to the present invention includes a color filter substrate, a liquid crystal layer, and an array substrate. The color filter substrate and the array substrate are stacked and combined as a whole, and the liquid crystal layer is disposed between the color filter substrate and the array substrate.

Figure 1:
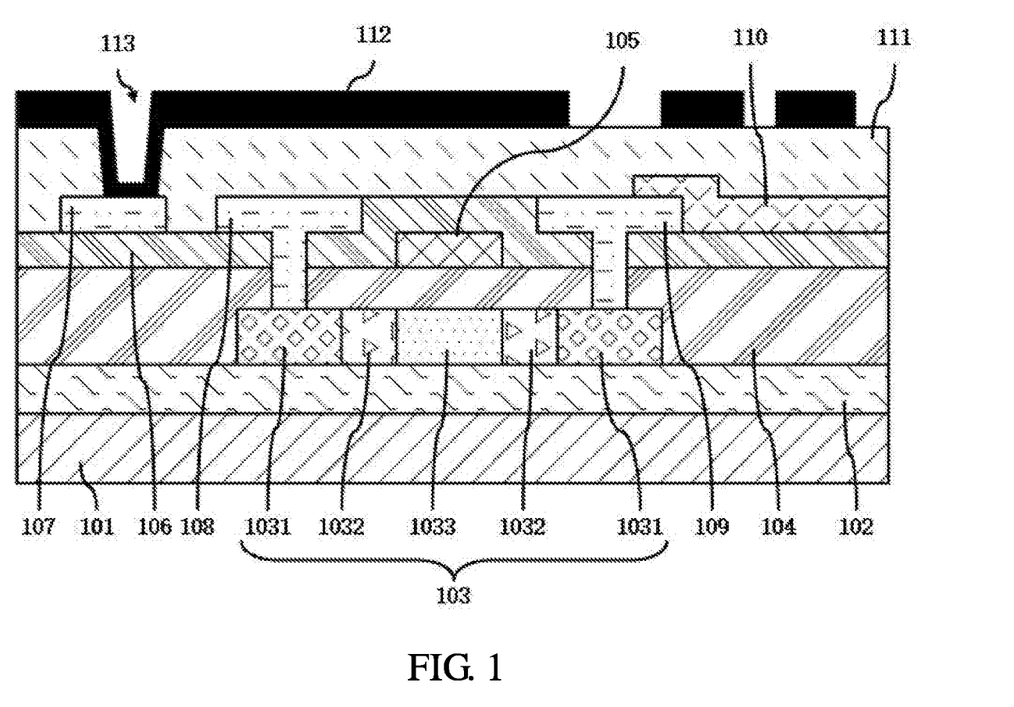
FIG. 1 is a schematic view of a first embodiment of an array substrate according to the present invention.
Figure 2:
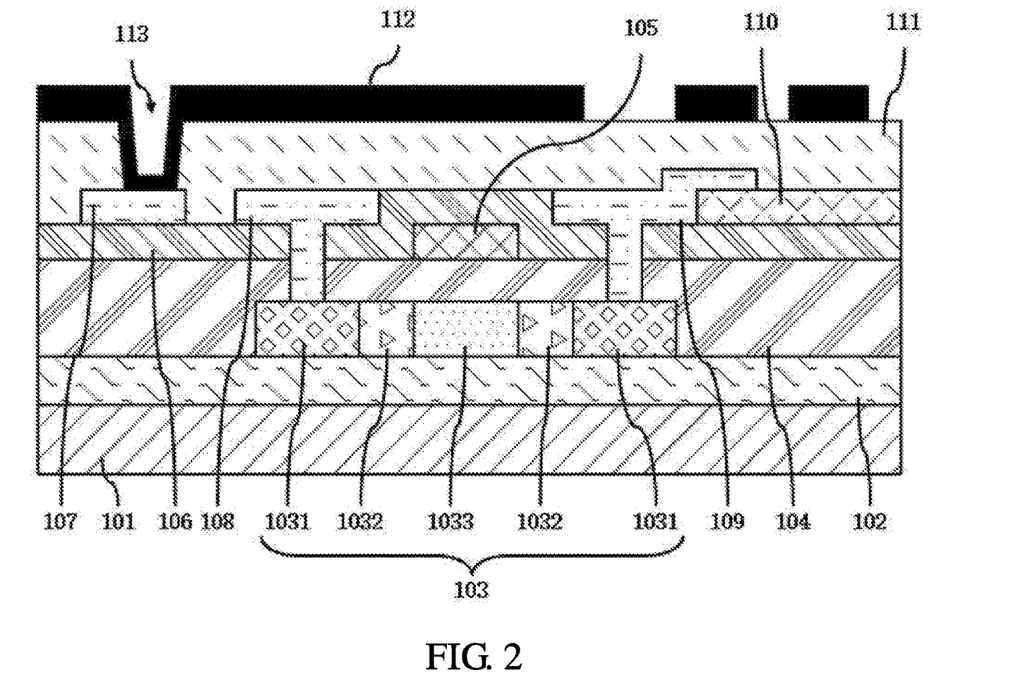
FIG. 2 is a schematic view of a second embodiment of an array substrate according to the present invention.
Figure 3:
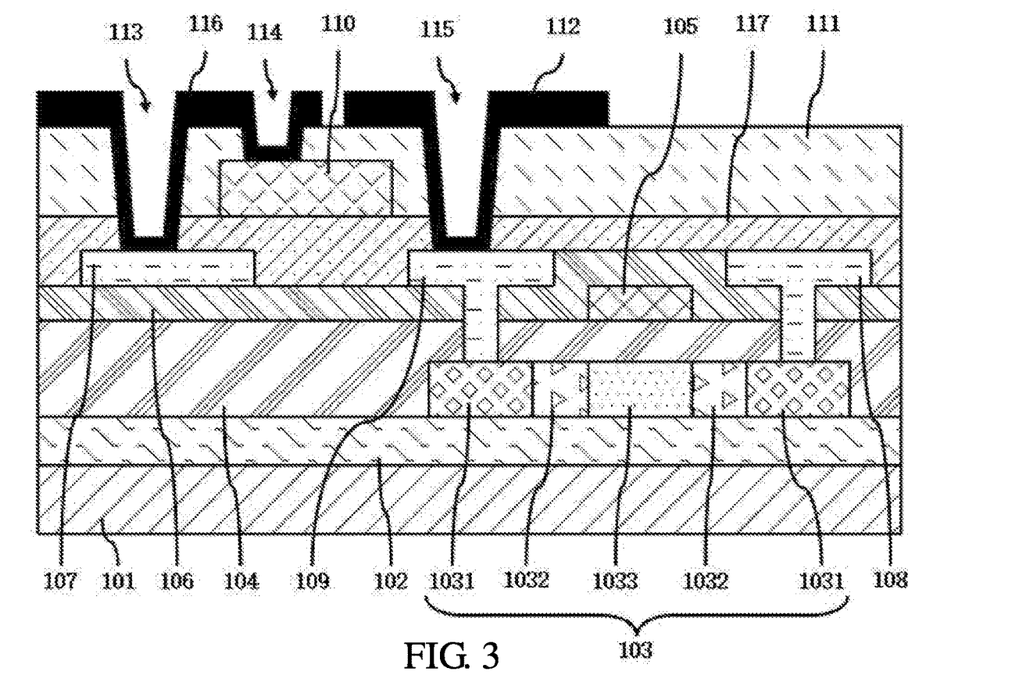
FIG. 3 is a schematic view of a third embodiment of an array substrate according to the present invention.
Figure 4:
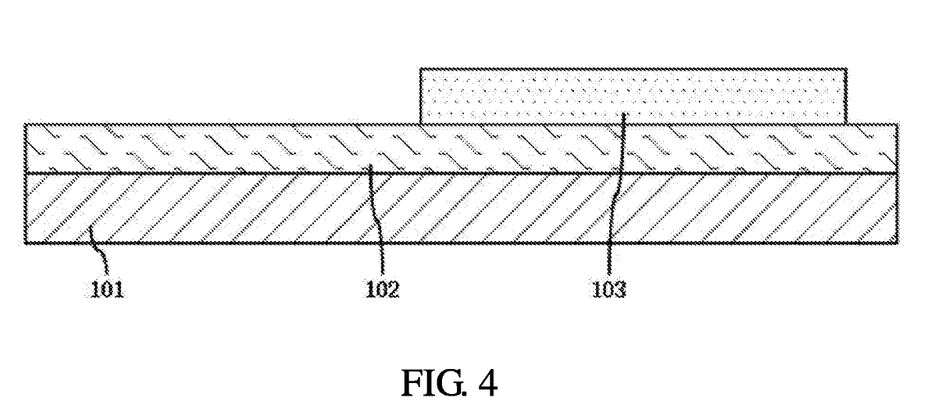
FIGS. 4 to 11 are schematic views of a manufacturing method of the third embodiment of the array substrate according to the present invention.
Figure 5:
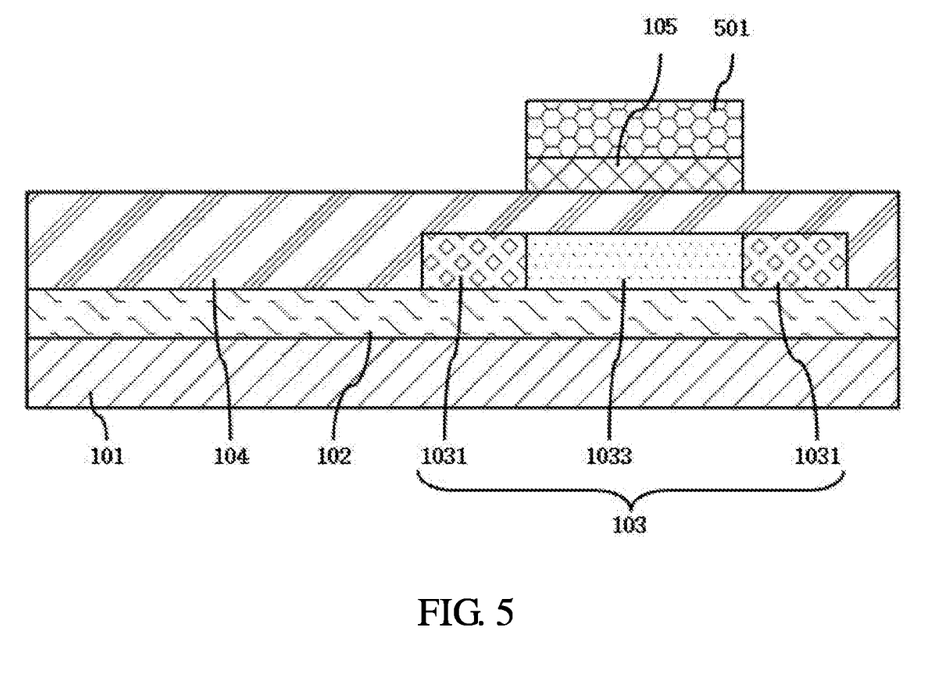
Figure 6:
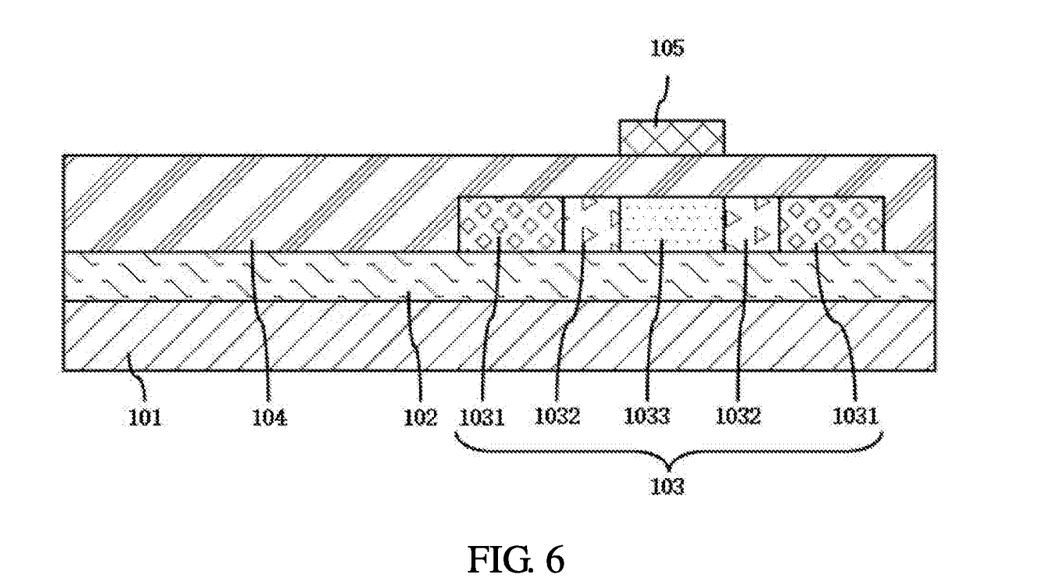
Figure 7:
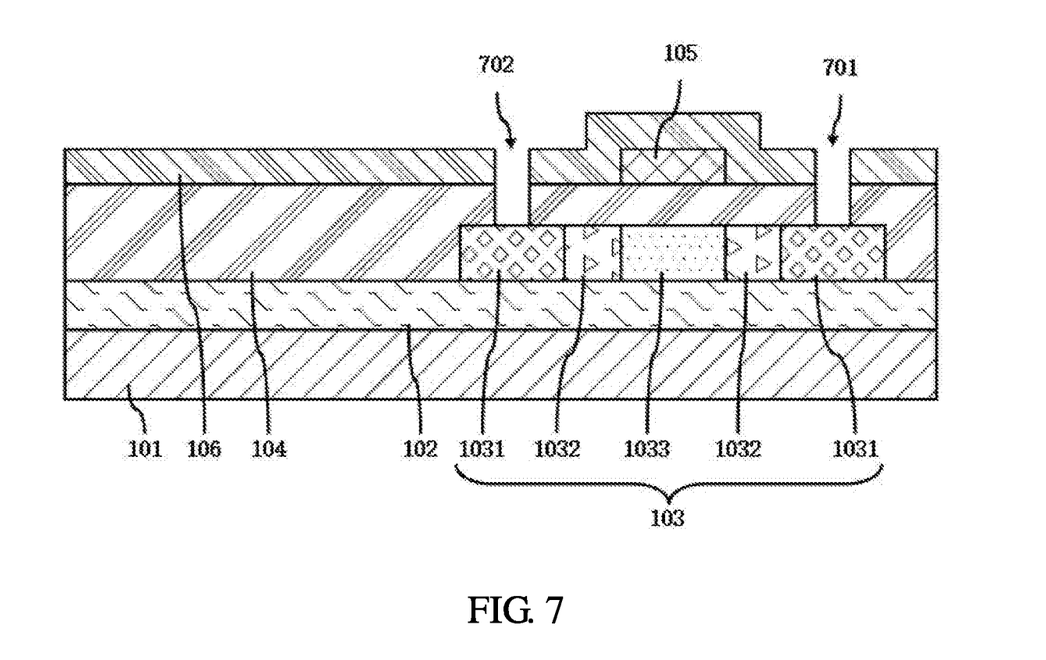
Figure 8:
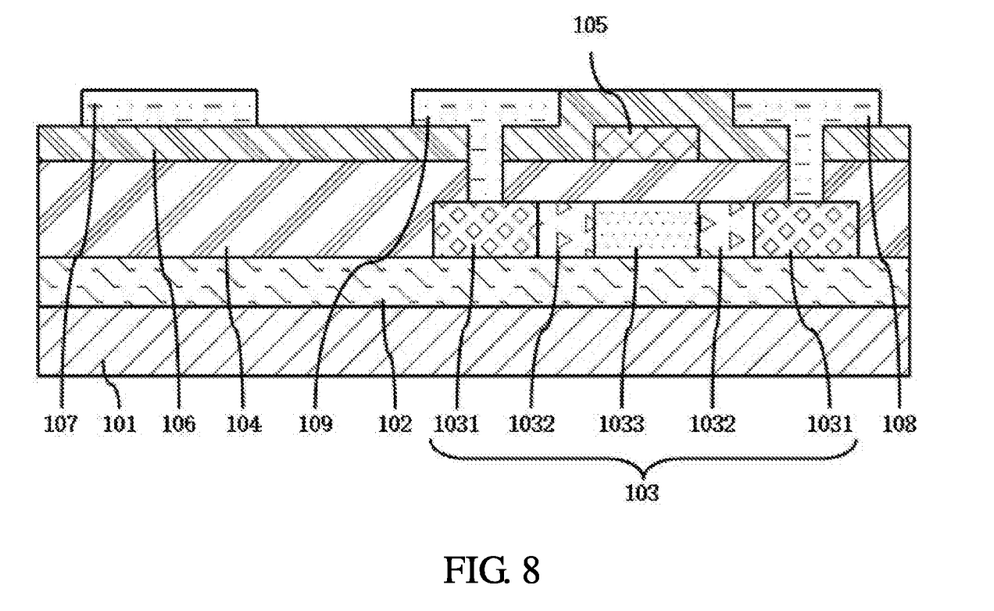
Figure 9:
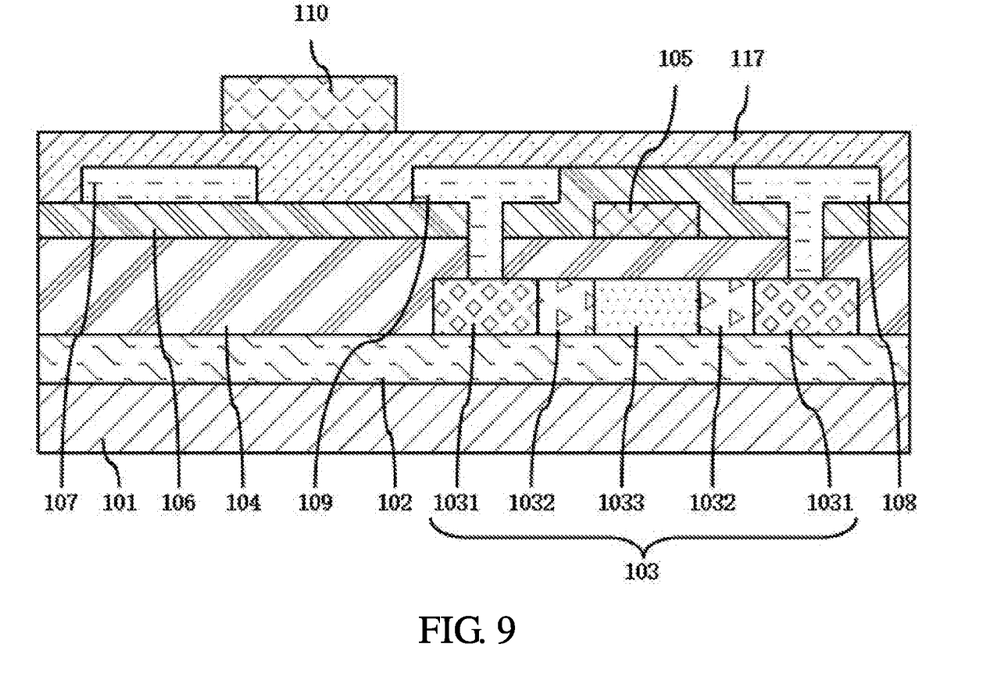
Figure 10:
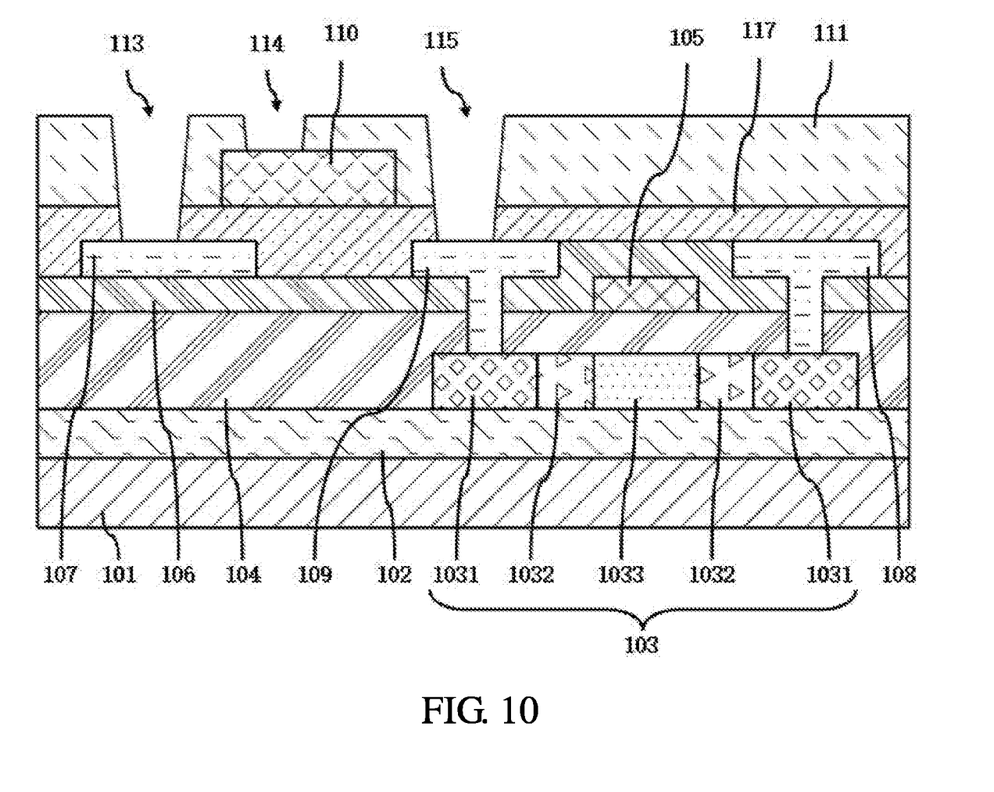
Figure 11:
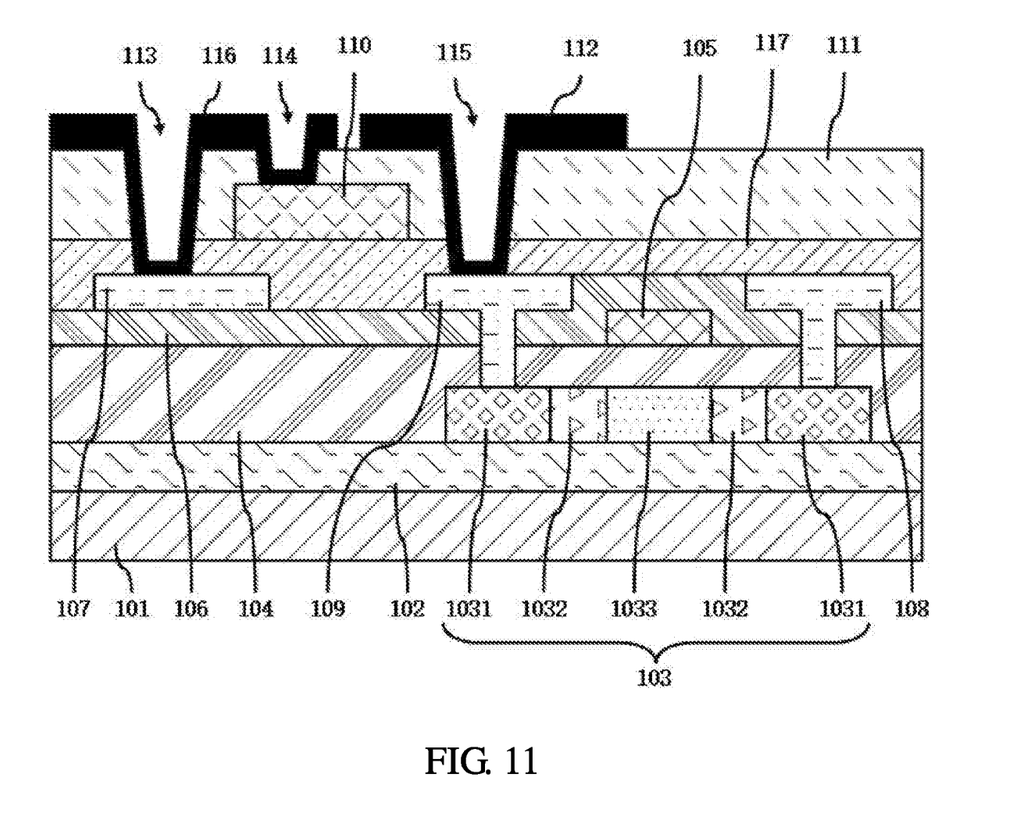

Referring to FIGS. 1 to 11, FIG. 1 is a schematic view of a first embodiment of an array substrate according to the present invention, FIG. 2 is a schematic view of a second embodiment of an array substrate according to the present invention, FIG. 3 is a third embodiment of an array substrate according to the present invention, and FIGS. 4 to 11 are schematic views of a manufacturing method of the third embodiment of the array substrate according to the present invention.

In the first to third embodiments of the array substrate according to the present invention, an array substrate includes a substrate 101, a buffer layer 102, an active layer 103, a first insulating layer 104, a gate electrode 105, a second insulating layer 106, a touch signal line 107, a source electrode 108, a drain electrode 109, a first electrode 110, a planarization layer 111, and a second electrode 112.

Wherein, the buffer layer 102 is disposed on the substrate 101.

The active layer 103 is disposed on the buffer layer 102. The active layer 103 is formed by disposing a semiconductor material layer on the buffer layer 102 and providing a first photomask process to the semiconductor material layer to form the active layer 103. The active layer 103 includes two first portions (heavily doped regions) 1031, two second portions (lightly doped regions) 1032, and a third portion 1033. The two second portions 1032 are respectively disposed on the respective sides of the third portion 1033, the two first portions 1031 are respectively disposed on respective sides of an entire body constituted by the third portion 1033 and the second portion 1032, the second portion 1032 is implanted with a second conductive element, and the first portion 1031 is implanted with a first conductive element. Material of the active layer 103 is polysilicon or amorphous silicon.

Namely, the active layer 103 is provided with two lightly doped regions 1032 and two heavily doped regions 1031. The two heavily doped regions 1031 are respectively located at respective sides of the active layer 103. The lightly doped regions 1032 are adjacent to the two respective heavily doped regions 1031 respectively. The source electrode 108 and drain electrode 109 are respectively connected to the two respective heavily doped regions 1031 of the active layer 103 through a first via and a second via both penetrating the second insulating layer 106.

The heavily doped region 1031 is formed before the gate electrode 105 formed, by using a first metal layer which has a first shielding area to be a first mask, and implanting the first conductive element to a portion of the active layer 103 that is not shielded by the first metal layer. The lightly doped region 1032 is formed after the gate electrode 105 formed, by using the gate electrode 105 which has a second shielding area to be a second mask, and implanting the second conductive element to a portion of the active layer 103 that is not shielded by the gate electrode 105.

The first conductive element and the second conductive element may be the same element. Alternatively, the first conductive element and the second conductive element are two different elements, respectively.

The first insulating layer 104 is disposed on the active layer 103 and on a portion of the buffer layer 102 where is except for the active layer 103.

The gate electrode 105 is disposed on the first insulating layer 104. The gate electrode 105 is formed by providing the first metal layer on the first insulating layer 104 and providing a second photomask process to the first metal layer to form the gate electrode 105.

Specifically, the gate electrode 105 is formed by sequentially disposing the first metal layer and a photoresist 501 on the first insulating layer 104, providing the second photomask process to the first metal layer so as to make the first metal layer with the first shielding area on a plane where the substrate 101 is provided, while maintaining to provide the second photomask process to the first metal layer which has the first shielding area, so as to make the first metal layer with the second shielding area on the plane where the substrate 101 is provided.

Wherein, the second shielding area is smaller than the first shielding area.

In addition, in the first portion 1031 of the active layer 103, the first conductive element is implanted, during the second photomask process is providing to the first metal layer, after the first metal layer is provided with the first shielding area, to the first portion 1031 of the active layer 103 that is not shielded by the first shielding area of the first metal layer.

In the second portion 1032 of the active layer 103, the second conductive element is implanted, when the second photomask process is providing to the first metal layer, after the first shielding area of the first metal layer is narrowed as the second shielding area, to the second portion 1032 of the active layer 103 that is not shielded by the second shielding area of the first metal layer.

The second insulating layer 106 is disposed on the gate electrode 105 and a portion of the first insulating layer 104 where is except for the gate electrode 105. The second insulating layer 106 is provided with a first via 701 and a second via 702. The first via 701 and the second via 702 are formed by providing a third photomask process to the first insulating layer 104 and the second insulating layer 106. The first via 701 and the second via 702 both penetrate through the second insulating layer 106 and the first insulating layer 104, and a position of the first via 701 and a position of the second via 702 are both corresponding to the two first portions 1031.

The touch signal line 107, the source electrode 108, and the drain electrode 109 are formed by providing a second metal layer on the second insulating layer 106, within the first via 701 and the second via 702, and providing a fourth photomask process to the second metal layer. The touch signal line 107, the source electrode 108, and the drain electrode 109 are all provided in the same layer and disposed on the second insulating layer 106. The source electrode 108 and the drain electrode 109 are both connected to the active layer 103. Specifically, the touch signal line 107, a portion of the source electrode 108, and a portion of the drain electrode 109 are disposed on the second insulating layer 106. Other portion of the source electrode 108 and other portion of the drain electrode 109 are both disposed in the first via 701 and the second via 702, and the other portion of the source electrode 108 and the other portion of the drain electrode 109 are both contacting with the two first portions 1031 of the active layer 103 in which the first conductive element are implanted.

The first electrode 110 is formed by disposing a first electrode layer on the second insulating layer 106 and providing a fifth photomask process to the first electrode layer. The first electrode 110 is disposed on the second insulating layer 106.

The planarization layer 111 is provided with a third via 113, the third via 113 is formed by providing a sixth photomask process to the planarization layer 111. The third via 113 penetrates the planarization layer 111, and the planarization layer 111 is disposed on the second insulating layer 106 and/or the first electrode 110.

The second electrode 112 is formed by providing a second electrode layer on the planarization layer 111 and within the third via 113, and providing a seventh photomask process to the second electrode layer. The second electrode 112 is disposed on the planarization layer 111.

Wherein, one of the first electrode 110 and the second electrode 112 is connected to the drain electrode 109, and the other of the first electrode 110 and the second electrode 112 is connected to the touch signal line 107.

At least one of the first electrode 110 and the second electrode 112 may be, for example, a transparent electrode.

The first, second, and the third embodiments of the array substrate according to the present invention are similar, and the differences described in below are that:

As shown in FIG. 1 and FIG. 2, in the first and second embodiments of the array substrate according to the present invention, the first electrode 110 is connected to the drain electrode 109; as shown in FIG. 3, in the third embodiment of the array substrate according to the present invention, the second electrode 112 is connected to the drain electrode 109 through a fifth via 115 provided in the planarization layer 111 and a third insulating layer 117.

In a case that the first electrode 110 is connected to the drain electrode 109, at least a portion of the first electrode 110 is disposed on the drain electrode 109 (as shown in FIG. 1): or at least a portion of the drain electrode 109 is disposed on the first electrode 110 (as shown in FIG. 2).

In a case that the first electrode 110 is connected to the drain electrode 109, the touch signal line 107 is connected to the second electrode 112 through a third via 113 provided in the planarization layer 111, as shown in FIG. 1 and FIG. 2.

As shown in FIG. 3, in the third embodiment of the array substrate according to the present invention, in the case that the second electrode 112 is connected to the drain electrode 109, the array substrate further includes the third insulating layer 117 and a connecting electrode 116 between the second insulating layer 106 and the planarization layer 111.

The third insulation layer 117 is disposed on a portion of the second insulation layer 106 which is except for the touch signal line 107, the source electrode 108 and the drain electrode 109, and on the touch signal line 107, the source electrode 108 and the drain electrode 109. The first electrode 110 is disposed on the third insulating layer 117, and the connecting electrode 116 is connected to the touch signal line 107 and the first electrode 110 through the third via 113 provided in the planarization layer 111 and the third insulating layer 117 and the connecting electrode 116 is connected to the touch signal line 107 and the first electrode 110 through a fourth via 114 provided in the planarization layer 111.

The first electrode 110 is disposed on the third insulating layer 117. The first electrode 110 is formed by providing a first electrode layer on the third insulating layer 117 which is stacked on the second insulating layer 106, and providing the fifth photomask process to the first electrode layer.

The planarization layer 111 is disposed on the first electrode 110 and a portion of the third insulating layer 117 where is except for the first electrode 110. The planarization layer 111 is further provided with the fourth via 114 and the fifth via 115. The third via 113, the fourth via 114, and the fifth via 115 all penetrate the planarization layer 111 and the third insulating layer 117. The third via 113, the fourth via 114, and the fifth via 115 are formed by providing the sixth photomask process on the planarization layer 111 and the third insulating layer 117.

The second electrode 112 and the connecting electrode 116 are formed by disposing the second electrode layer on the planarization layer 111 and within the third via 113, the fourth via 114, and the fifth via 115, and providing the seventh photomask process to the second electrode layer.

The third via 113, the fourth via 114, and the fifth via 115 all penetrate the planarization layer 111 and the third insulating layer 117.

Figure 12:
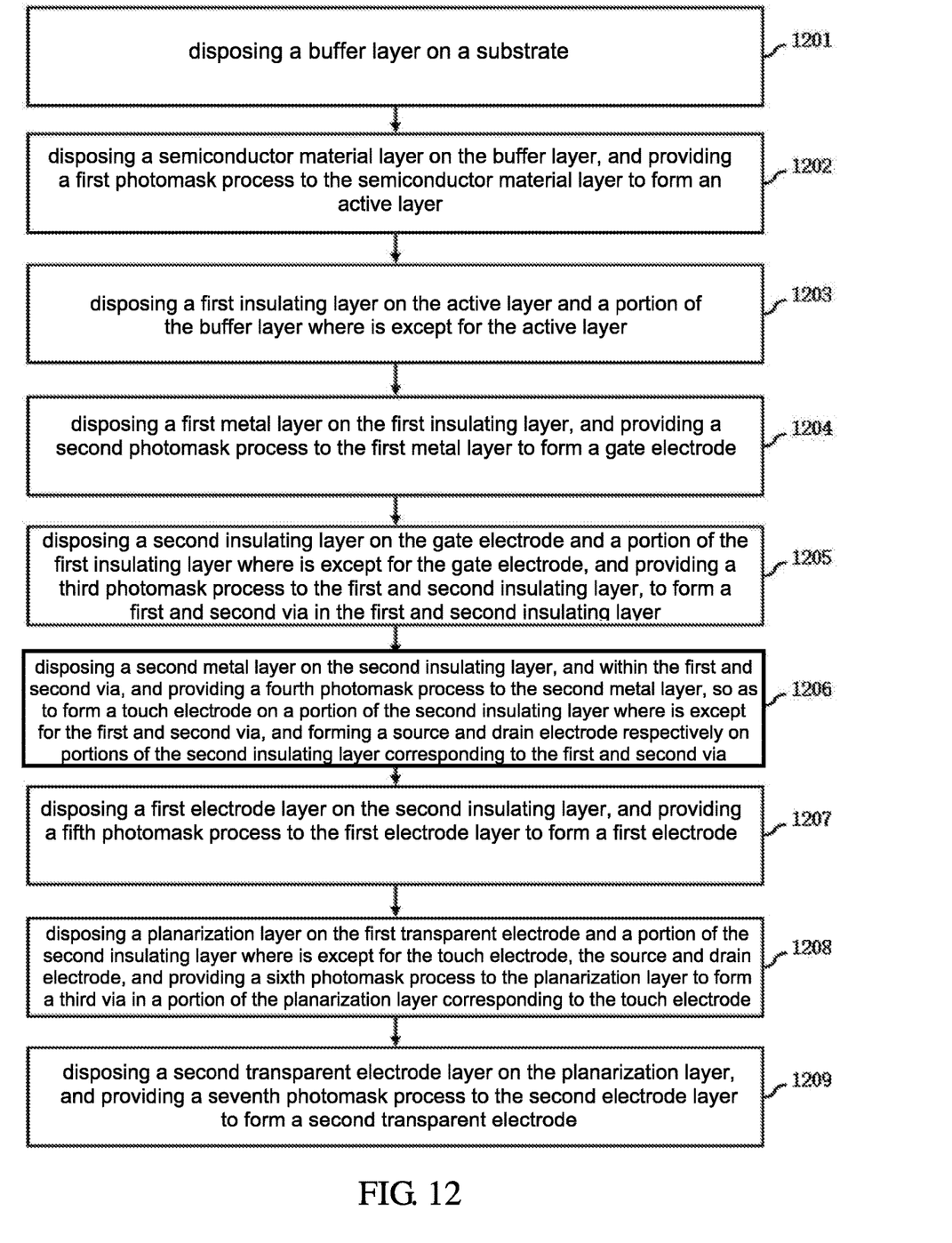
FIG. 12 is a flowchart of the first embodiment of a manufacturing method of the array substrate according to the present invention.

Referring to FIG. 12, FIG. 12 is a flowchart of the first embodiment of a manufacturing method of an array substrate according to the present invention.

A manufacturing method of an array substrate of this embodiment includes the following steps:

Step A (step 1201): providing a buffer layer 102 on a substrate 101.

Step B (step 1202): disposing a semiconductor material layer on the buffer layer 102, and providing a first photomask process to the semiconductor material layer to form the active layer 103. The material corresponding to the active layer 103 is polysilicon or amorphous silicon.

Step C (step 1203): disposing a first insulating layer 104 on the active layer 103 and the buffer layer 102. Specifically, the first insulating layer 104 is disposed on the active layer 103 and a portion of the buffer layer 102 where is except for the active layer 103.

Step D (step 1204): disposing a first metal layer on the first insulating layer 104, and providing a second photomask process to the first metal layer to form a gate electrode 105.

Wherein, the step D includes:

Step d1: sequentially disposing the first metal layer and a photoresist 501 on the first insulating layer 104, and providing the second photomask process to the first metal layer so as to make the first metal layer with a first shielding area on a plane where the substrate 101 is provided, and implanting a first conductive element into a first portion 1031 of the active layer 103 that is not shielded by the first shielding area of the first metal layer.

Step d2: maintaining to provide the second photomask process to the first metal layer which has the first shielding area, so as to make the first metal layer with the second shielding area on the plane where the substrate 101 is provided, and implanting a second conductive element to a second portion 1032 where the active layer 103 is not shielded by the gate electrode 105 which has the second shielding area.

Wherein, the second shielding area is smaller than the first shielding area. The first shading range is smaller than the coverage of the active layer 103.

Step E (step 1205): disposing a second insulating layer 106 on the gate electrode 105 and the first insulating layer 104. Specifically, the second insulating layer 106 is disposed on the gate electrode 105 and a portion of the first insulating layer 104 where is except for the gate electrode 105, and the first insulating layer 104 and the second insulating layer 104 are provided with a third photomask process to form a first via 701 and a second via 702 in the first insulating layer 104 and the second insulating layer 106. A position of the first via 701 is corresponding to two first portions 1031 of the active layer 103 and a position of the second via 702 is corresponding to two first portions 1031 of the active layer 103 in which the first conductive element is implanted. The via 701 and the second via 702 both penetrate through the first insulating layer 104 and the second insulating layer 106.

Step F (Step 1206): disposing a second metal layer on the second insulating layer 106, and providing a fourth photomask process to the second metal layer to form a touch signal line on the second insulating layer 106 and form the source electrode 108 and the drain electrode 109 on the second insulating layer 106. Specifically, the second metal layer is disposed on the second insulating layer 106, and within the first via 701 and the second via 702. A fourth photomask process is providing to the second metal layer so as to form the touch signal line 107 on a portion of the second insulating layer 106 where is except for the first via 701 and the second via 702, and the source electrode 108 and the drain electrode 109 are both formed on portions of the second insulating layer 106 corresponding to the first via 701 and the second via 702. The source electrode 108 and the drain electrode 109 are connected to the active layer 103.

Step G (step 1207): providing a first electrode layer on the second insulating layer 106, and providing a fifth mask process to the first electrode layer to form the first electrode 110.

Step H (step 1208): disposing a planarization layer 111 on the first electrode 110 and the second insulating layer 106. Specifically, the planarization layer 111 is disposed on the first electrode 110 and a portion of the second insulating layer 106 where is except for the touch signal line 107, the source electrode 108, and the drain electrode 109, and a sixth mask process is provided to the planarization layer 111 to form the third via 113 in a portion of the planarization layer 111 which is corresponding to the touch signal line 107.

Step I (step 1209), providing a second electrode layer on the planarization layer 111, and providing a seventh mask process to the second electrode layer to form the second electrode 112. Specifically, the second electrode layer is disposed on the planarization layer 111 and within the third via 113, and a seventh mask process is provided to the second electrode layer to form the second electrode 112.

Wherein, one of the first electrode 110 and the second electrode 112 is connected to the drain electrode 109. The other of the first electrode 110 and the second electrode 112 is connected to the touch signal line 107.

The first and second embodiments of the manufacturing method of the array substrate according to the present invention are similar, and the differences are described in below:

In the first embodiment of the manufacturing method of the array substrate according to the present invention, the first electrode 110 is connected to the drain electrode 109, in the case that the first electrode 110 is connected to the drain electrode 109, at least a portion of the first electrode 110 is disposed on the drain electrode 109. The step G is provided after the step F, and the step G further includes:

disposing the first electrode layer on the second insulating layer 106 and the drain electrode 109, and providing the fifth photomask process to the first electrode layer to form the first electrode 110;

Alternatively, in the case that the first electrode 110 is connected to the drain electrode 109, at least a portion of the drain electrode 109 is disposed on the first electrode 110. The Step F is provided after step G. The Step F further includes:

disposing the second metal layer on the second insulating layer 106 and the first electrode 110, and providing the fourth photomask process to the second metal layer to form the touch signal line 107 and form the source electrode 108 and the drain electrode 109 on the second insulating layer.

After the step H, and before step I, the method further includes the following steps:

Step J: providing a sixth mask process to the planarization layer 111 to form the third via 113 in the planarization layer 111 which is corresponding to the touch signal line 107.

The touch signal line 107 is connected to the second electrode 112.

In the second embodiment of the manufacturing method of the array substrate according to the present invention, the second electrode 112 is connected to the drain electrode 109.

In the second embodiment of the manufacturing method of the array substrate according to the present invention, the array substrate further includes a third insulating layer 117 and a connecting electrode 116.

After the step F, and before the step G, the method further includes the following steps:

Step K: disposing the third insulating layer 117 on the second insulation layer 106 where is except for the touch signal lines 107, the source electrodes 108, and the drain electrodes 109, and on the touch signal lines 107, the source electrode and the drain electrodes 108.

The first electrode 110 is disposed on the third insulation layer 117. The connecting electrode 116 is connected to the touch signal line 107 and the first electrode 110.

The step G includes:

disposing the first electrode layer on the third insulation layer 117 which is stacked on the second insulation layer 106, and providing the fifth photomask process to the first electrode layer to form the first electrode 110.

The planarization layer 111 is further provided with a fourth via 114 and a fifth via 115. The third via 113, the fourth via 114, and the fifth via 115 all penetrate through the planarization layer 111 and the third insulating layer 117, the step H further includes:

disposing the planarization layer 111 on the first electrode 110 and on the third insulating layer 117. Specifically, the planarization layer 111 is disposed on the first electrode 110 and a portion of the third insulating layer 117 where is except for the first electrode 110 and the third insulating layer 117, and a sixth photomask process is provided to the planarization layer 111 and the third insulating layer 117, so as to form the third via 113, the fourth via 114 and the fifth via 115 on portions of the planarization layer 111 and the third insulating layer 117 where are corresponding to the touch signal line 107, the first electrode 110, and the drain electrode 109.

After the step H, and before the step I, the method further includes the following steps:

Step L: providing the sixth photomask process on the planarization layer 111 and the third insulation layer 117 to form the third via 113, the fourth via 114 and the fifth via 115 on portions of the planarization layer 111 and the third insulating layer 117 where are corresponding to the touch signal line 107, the first electrode 110, and the drain electrode 109.

The step I further includes:

disposing the second electrode layer on the planarization layer 111, and providing the seventh mask process to the second electrode layer, so as to form the second electrode 112 and the connecting electrode 116. Specifically, the second electrode layer is disposed on the planarization layer 111 and within the third via 113, the fourth via 114 and the fifth via 115, and the seventh mask process is provided to the second electrode layer to form the second electrode 112 and the connecting electrode 116.

The connecting electrode 116 is connected to the touch signal line 107 and the first electrode 110.

The present invention only needs to use seven photomask processes to complete the manufacturing of the array substrate based on the LTPS technology. Compared to the conventional thin film transistor array substrate based on the LTPS technology, at least three photomask processes are reduced. Therefore, the present invention can reduce the LTPS-based technology. The present invention can reduce the photomask processes required during the manufacturing of the array substrate based on the LTPS technology, and shorten the production cycle of the array substrate.

The present invention also achieves without increasing the photomask process, the touch signal line 107 is formed in an array substrate and is compatible with an in-cell touch design.

In summary, although the present invention has been disclosed in the preferred embodiments, the above preferred embodiments are not intended to limit the present invention. Those skilled in the art can perform various methods without departing from the spirit and scope of the present invention. As such, the protection scope of the present invention is defined by the scope of the claims.

What is claimed is:

1. An array substrate, comprising:
a substrate;
a buffer layer disposed on the substrate;
an active layer disposed on the buffer layer;
a first insulating layer;
a gate electrode disposed on the first insulating layer;
a second insulating layer;
a touch signal line, a source electrode, and a drain electrode all provided in the same layer and disposed on the second insulating layer, wherein the source electrode is connected to the active layer and the drain electrode is connected to the active layer;
a first electrode disposed on the second insulating layer;
a planarization layer disposed on the first electrode; and
a second electrode disposed on the planarization layer;
wherein one of the first electrode and the second electrode is connected to the drain electrode, and the other of the first electrode and the second electrode is connected to the touch signal line, wherein the array substrate further comprises: a third insulating layer provided between the second insulating layer and the planarization layer; and a connecting electrode, wherein the second electrode is connected to the drain electrode through a fifth via provided in the planarization layer and the third insulating layer; and the first electrode is disposed on the third insulating layer, the connecting electrode is connected to the touch signal line and the first electrode through a third via provided in the planarization layer and the third insulating layer and the connecting electrode is connected to the touch signal line and the first electrode through a fourth via provided in the planarization layer.

2. The array substrate according to claim 1, wherein the first electrode is connected to the drain electrode, at least a portion of the first electrode is disposed on the drain electrode; and
the touch signal line is connected to the second electrode through a third via provided in the planarization layer.

3. The array substrate according to claim 1, wherein the first electrode is connected to the drain electrode, at least a portion of the drain electrode is disposed on the first electrode; and
the touch signal line is connected to the second electrode through a third via provided in the planarization layer.

4. The array substrate according to claim 1, wherein the active layer is provided with two lightly doped regions and two heavily doped regions, the two heavily doped regions are respectively provided at two respective side ends of the active layer, and the two lightly doped regions are respectively adjacent to the two respective heavily doped regions; and
the source electrode and the drain electrode are respectively connected to the two respective heavily doped regions of the active layer through a first via and a second via both penetrating the second insulating layer.

5. A manufacturing method of an array substrate, comprising:
a step A of disposing a buffer layer on a substrate;
a step B of disposing a semiconductor material layer on the buffer layer, and providing a first photomask process to the semiconductor material layer to form an active layer;
a step C of disposing a first insulating layer on the active layer and the buffer layer;
a step D of disposing a first metal layer on the first insulating layer, and providing a second photomask process to the first metal layer to form a gate electrode;
a step E of disposing a second insulating layer on the gate electrode and the first insulating layer;
a step F of disposing a second metal layer on the second insulating layer, and providing a fourth photomask process to the second metal layer to form a touch signal line on the second insulating layer, and to form a source electrode and a drain electrode on the second insulating layer, wherein the source electrode and the drain electrode are connected to the active layer;
a step G of disposing a first electrode layer on the second insulating layer, and providing a fifth photomask process to the first electrode layer to form a first electrode;
a step H of disposing a planarization layer on the first electrode and the second insulating layer; and
a step I of disposing a second electrode layer on the planarization layer, and providing a seventh photomask process to the second electrode layer to form a second electrode;

wherein one of the first electrode and the second electrode is connected to the drain electrode, and the other of the first electrode and the second electrode is connected to the touch signal line.

6. The manufacturing method of the array substrate according to claim 5, wherein in a case that the first electrode is connected to the drain electrode, at least a portion of the first electrode is disposed on the drain electrode, the step G is provided after the step F, and the step G further comprises:
disposing the first electrode layer on the second insulating layer and the drain electrode, and providing a fifth photomask process to the first electrode layer to form the first electrode.

7. The manufacturing method of the array substrate according to claim 5, wherein in a case that the first electrode is connected to the drain electrode, at least a portion of the drain electrode is disposed on the first electrode, the step F is provided after the step G, and the step F further comprises:
disposing the second metal layer on the second insulating layer and the first electrode, and providing the fourth photomask process to the second metal layer to form the touch signal line on the second insulating layer, and to form the source electrode and the drain electrode on the second insulating layer.

8. The manufacturing method of the array substrate according to claim 5, wherein after the step H and before the step I, the method further comprises:
a step J of providing a sixth photomask process to the planarization layer to form a third via in a portion of the planarization layer corresponding to the touch signal line.

9. The manufacturing method of the array substrate according to claim 5, wherein in a case that the second electrode is connected to the drain electrode, the array substrate further comprises a third insulating layer; and
after the step F and before the step G, the method further comprises:
a step K of disposing the third insulating layer on the second insulating layer, the touch signal line, the source electrode, and the drain electrode.

10. The manufacturing method of the array substrate according to claim 9, wherein the first electrode is disposed on the third insulating layer; and
the step G further comprises:
disposing the first electrode layer on the third insulating layer stacked on the second insulating layer, and providing the fifth photomask process to the first electrode layer to form the first electrode.

11. The manufacturing method of the array substrate according to claim 9, wherein the step H further comprises:
disposing the planarization layer on the first electrode and on the third insulating layer.

12. The manufacturing method of the array substrate according to claim 11, wherein after the step H and before the step I, the method further comprises:
a step L of providing the sixth photomask process to the planarization layer and the third insulating layer to respectively form a third via, a fourth via, and a fifth via in a portion of the planarization layer and the third insulating layer respectively corresponding to the touch signal line, the first electrode and the drain electrode.

13. The manufacturing method of the array substrate according to claim 11, wherein the array substrate further comprises a connecting electrode; and the step I further comprises:
disposing the second electrode layer on the planarization layer, and providing the seventh photomask process to the second electrode layer to form the second electrode and the connecting electrode, wherein the connecting electrode is connected to the touch signal line and the first electrode.

14. A display panel, including a color filter substrate, a liquid crystal layer, and an array substrate, wherein the color filter substrate and the array substrate are stacked and integrated as a whole, and the liquid crystal layer is disposed between the color filter substrate and the array substrate;
the array substrate comprising:
a substrate;
a buffer layer disposed on the substrate;
an active layer disposed on the buffer layer;
a first insulating layer;
a gate electrode disposed on the first insulating layer;
a second insulating layer;
a touch signal line, a source electrode, and a drain electrode all provided in the same layer and disposed on the second insulating layer, wherein the source electrode is connected to the active layer and the drain electrode is connected to the active layer;
a first electrode disposed on the second insulating layer;
a planarization layer disposed on the first electrode; and
a second electrode disposed on the planarization layer;
wherein one of the first electrode and the second electrode is connected to the drain electrode, and the other of the first electrode and the second electrode is connected to the touch signal line,
wherein the array substrate further comprises: a third insulating layer provided between the second insulating layer and the planarization layer; and a connecting electrode, wherein the second electrode is connected to the drain electrode through a fifth via provided in the planarization layer and the third insulating layer; and
the first electrode is disposed on the third insulating layer, the connecting electrode is connected to the touch signal line and the first electrode through a third via provided in the planarization layer and the third insulating layer and the connecting electrode is connected to the touch signal line and the first electrode through a fourth via provided in the planarization layer.

15. The display panel according to claim 14, wherein the first electrode is connected to the drain electrode, at least a portion of the first electrode is disposed on the drain electrode; and
the touch signal line is connected to the second electrode through a third via provided in the planarization layer.

16. The display panel according to claim 14, wherein the first electrode is connected to the drain electrode, at least a portion of the drain electrode is disposed on the first electrode; and
the touch signal line is connected to the second electrode through a third via provided in the planarization layer.

17. The display panel according to claim 14, wherein the active layer is provided with two lightly doped regions and two heavily doped regions, the two heavily doped regions are respectively provided at two respective side ends of the active layer, the two lightly doped regions are respectively adjacent to the two respective heavily doped regions; and
the source electrode and the drain electrode are respectively connected to the two respective heavily doped regions of the active layer through a first via and a second via both penetrating the second insulating layer.

* * * * *